US007140101B2

(12) United States Patent
Cheng et al.

(10) Patent No.: US 7,140,101 B2
(45) Date of Patent: Nov. 28, 2006

(54) METHOD FOR FABRICATING ANISOTROPIC CONDUCTIVE SUBSTRATE

(75) Inventors: Shih-Jye Cheng, Hsinchu (TW); An-Hong Liu, Tainan (TW); Yeong-Her Wang, Tainan (TW); Yuan-Ping Tseng, Hsinchu (TW); Yao-Jung Lee, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 409 days.

(21) Appl. No.: 10/671,735

(22) Filed: Sep. 29, 2003

(65) Prior Publication Data

US 2005/0066521 A1 Mar. 31, 2005

(51) Int. Cl.
*H05K 3/36* (2006.01)
*B32B 5/16* (2006.01)

(52) U.S. Cl. ............................ 29/830; 29/829; 29/840; 29/877; 174/84 R; 428/209; 428/901

(58) Field of Classification Search .................. 29/825, 29/830–832, 840–843, 877, 884; 438/106, 438/118, 123; 156/295, 252, 230–235; 439/91, 439/66; 228/180.21; 428/209, 323, 418
See application file for complete search history.

(56) References Cited

U.S. PATENT DOCUMENTS 5,262,226 A * 11/1993 Yoshida ...................... 428/209
5,819,406 A * 10/1998 Yoshizawa et al. ........... 29/877
6,344,156 B1 2/2002 Yamada et al.
6,923,883 B1 * 8/2005 Kissell et al. ............... 156/259

* cited by examiner

*Primary Examiner*—Minh Trinh
(74) *Attorney, Agent, or Firm*—Birch, Stewart, Kolasch & Birch, LLP

(57) ABSTRACT

A method for fabricating an anisotropic conductive substrate is disclosed. A back holder has metal pins on a surface thereof. A liquid compound is formed on the surface of the back holder with metal pins. The liquid compound is pressed to deform the metal pins into electrodes in the liquid compound. The thickness between upper surface and lower surface of the liquid compound is between 25 μm and 250 μm. The electrodes have upper ends and lower ends exposed from upper surface and lower surface of the liquid compound to provide electrical contact of anisotropic conduction.

10 Claims, 3 Drawing Sheets

METHOD FOR FABRICATING ANISOTROPIC CONDUCTIVE SUBSTRATE

FIELD OF THE INVENTION

The present invention relates to a method for fabricating an electrical interposer substrate for semiconductor test and, more particularly, to a method for fabricating an anisotropic conductive substrate.

BACKGROUND OF THE INVENTION

The conventional printed circuit board is made of glass fiber reinforced resin, and is laser-drilled through its upper and lower surfaces to make through holes. A layer of metal is filled in the drilled through holes by electroplating to attain to vertical electrical connection. The electroplated metal layer covers the entire surface of the printed circuit board including the drilled through holes, therefore it cannot be provided for anisotropic electrical connection unless the metal layer connecting high-pitch via went through a highly accurate etching processes.

Conventionally Anisotropic Conductive Film (ACF) is an adhesive film with anisotropic conductivity, which is used in the connection and adherence of electrical devices, such as the anisotropic conductive film disclosed in U.S. Pat. No. 6,344,156 entitled "ANISOTROPIC CONDUCTIVE ADHESIVE FILM". The anisotropic conductive adhesive film is used in outer lead bonding (OLB), bump connection of the Tape Carrier Package (TCP) or combination of IC chips with the LCD panels by Chip-On-Glass bonding. The anisotropic conductive film is an insulating resin containing conductive particles properly. To acquire vertical conductivity, the conductive particles must have same size and with uniformity distribution. Meanwhile, the electrical devices should have extruded electrodes, such as bumps or pillar, to stick into the anisotropic conductive film. When the distance between the extruded electrode and outer circuit board is close enough corresponding to the diameter of an electric particle, the anisotropic conductivity can be acquired. Therefore, the conventional anisotropic conductive film is used in the adherence of electrical devices and outer circuit board, but it is improper to an interposer between semiconductor burn-in testing apparatus and wafer under test due to adhesion and reactivity of the anisotropic conductive film.

SUMMARY OF THE INVENTION

A primary object of the present invention is to provide a method for fabricating an anisotropic conductive substrate. A liquid compound is formed on a back holder with metal pins. After baking, the plate is pressed to deform the metal pins into electrodes that are bonded in the liquid compound. The electrodes electrically connect the upper and lower surfaces of the liquid compound, but not connect each other to provide anisotropic conduction.

According to a method for fabricating an anisotropic conductive substrate of the present invention, a back holder with metal pins is provided in the first place. The distribution density of metal pins is between $10^3$ mm$^{-2}$ and $10^8$ mm$^{-2}$. The pitch between the metal pins is from 0.5 to 30 μm. It is preferable that a removable layer, such as photoresist, is formed on between the back holder and the liquid compound. The liquid compound is formed on the back holder, with thickness between 25 and 250 μm. After baking the liquid compound, a top plate is pressed to deform the metal pins into a plurality of electrodes which are "frozen" inside the liquid compound and to shape the liquid compound. The electrodes electrically connect the upper surface with the lower surface of the liquid compound. Thereafter, the back holder is removed so that the liquid compound with electrodes became an anisotropic conductive substrate for anisotropic conducting. It could be used as an interposer between semiconductor test apparatus and wafer under test.

DETAIL DESCRIPTION OF THE INVENTION

Figure 1:
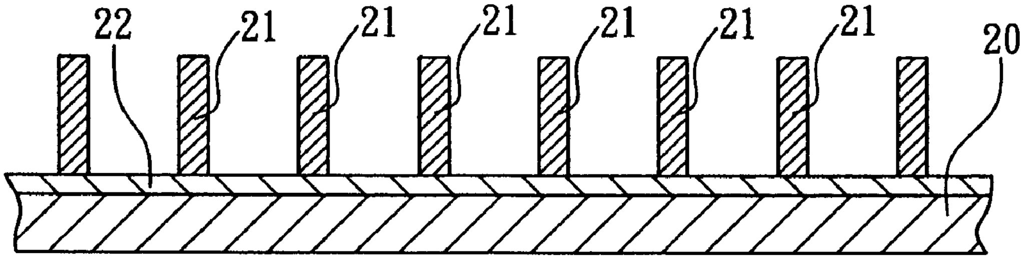
FIG. 1 is a cross-sectional view of a back holder provided by a method for fabricating an anisotropic conductive substrate in accordance with the present invention.

Please refer to the drawings attached, present invention will be described by means of an embodiment below. Referring to FIG. 1, a method for fabricating an anisotropic conductive substrate in accordance with the present invention. The anisotropic conductive substrate can be independently formed which is different from anisotropic conductive film or paste coated on a medium. In this embodiment, a back holder 20, such as metal or ceramic, is provided. A plurality of metal pins 21, such as gold or its alloy, are formed on a surface of back holder 20, which are fabricated by half-etching, wire-bonding, planting or micro electro mechanical system (MEMS) technology. The metal pins 21 are ductile and are arranged on a surface of the back holder 20 in high density. The pitch between the metal pins 21 is from 0.5 μm to 30 μm, and the distribution density of the metal pins 21 is from $10^3$ mm$^{-2}$ to $10^8$ mm$^{-2}$. It is preferable that a removable layer 22, such as positive photoresist, is formed on the back holder 20, so as to easily remove from the back holder 20. In this embodiment, the metal pins 21 are cone shapes or cylinder shapes.

Figure 2:
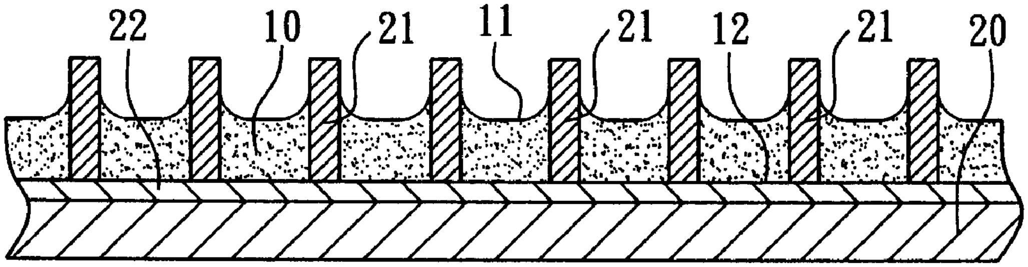
FIG. 2 is a cross-sectional view of the back holder formed with a liquid compound in accordance with the present invention.

As shown in FIG. 2, a liquid compound 10 is formed on the surface of back holder 20 with metal pins 21 by liquid coating method selected from spin coating, printing, spraying and dispensing. The liquid compound 10 is selected from the group of photoresist solution and low K dielectric thermosetting material. In this embodiment, the liquid compound 10 is a negative photoresist, containing low K dielectric polymer such as polyimide, BCB, and other photosensitive materials. MICRO CHEM Co. also provides a thick photoresist with series No. SU-8 2000 which is applicable to the liquid compound 10 in the present invention. Especially the liquid compound 10 is transparent after curing for inspecting the metal pins 21 (electrode) inside. The liquid compound 10 will become a film after baking. The liquid compound 10 has an upper surface 11 and a lower surface 12.

Figure 3:
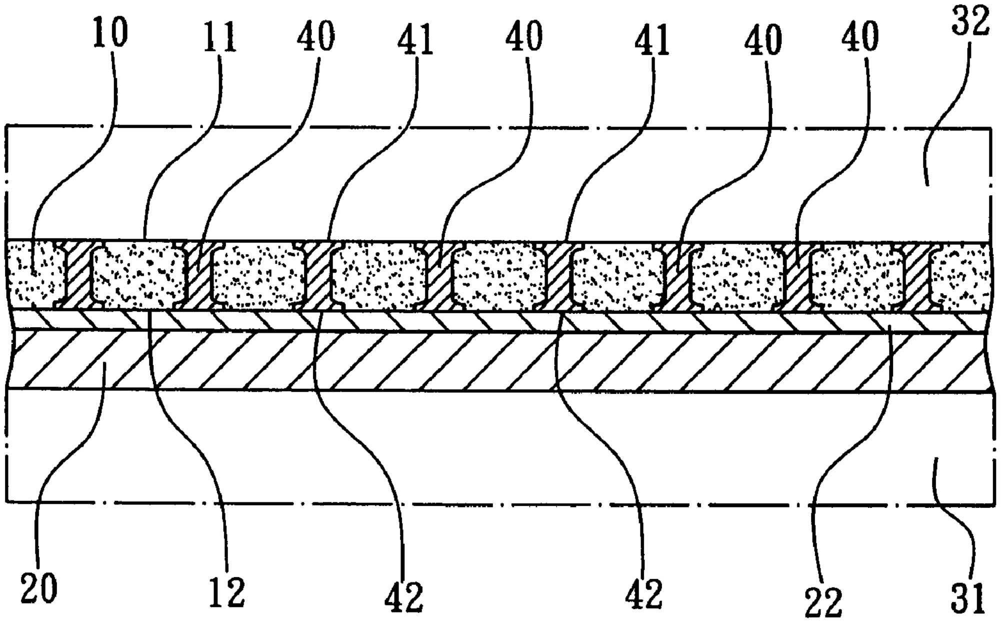
FIG. 3 is a cross-sectional view of the back holder under compression in accordance with the present invention.
Figure 4:
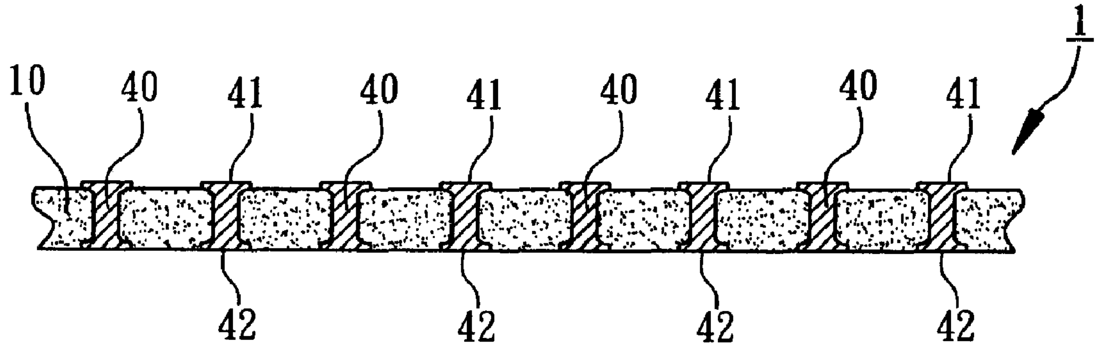
FIG. 4 is a cross-sectional view of an anisotropic conductive substrate in accordance with the present invention.

Thereafter, as shown in FIG. 3, then the liquid compound 10 on the back holder 20 is compressed by a top plate 31. The back holder 20 and liquid compound 10 are compressed between a bottom plate 32 and a top plate 31. The top plate 31 deforms the metal pins 21 on back holder 20 and reshape the liquid compound 10. So the metal pins 21 change their shape to into a plurality of electrodes 40 in the liquid compound 10. And the upper surface 11 of the liquid compound 10 is pressed to be even. The liquid compound 10 is cured during the compressing step simultaneously. The thickness of the liquid compound 10 is between 25 μm and 250 μm. Each electrode 40 has an upper end 41 and a lower end 42 correspondingly exposed on the upper surface 11 and the lower surface 12 of liquid compound 10. After curing the liquid compound 10, the electrodes 40 are "frozen" in the liquid compound 10 and vertically and electrically connect the upper surface 11 with the lower surface 12 of liquid compound 10. Thereafter, the removable layer 22 is easily removed after exposing the removable layer 22 passing through the transparent liquid compound 10 so that the back holder 20 can be separated from the liquid compound 10. Alternatively the back holder 20 is removed by means of grinding or etching. The electrodes 40 are electrical independence, and there is no relationship of electrical connection among the electrodes. At this time, the liquid compound 10 with electrodes 40 becomes an anisotropic conductive substrate 1, as shown in FIG. 4. In this embodiment, the anisotropic conductive substrate 1 comprises a low K dielectric liquid compound 10 and a plurality of electrodes 40 arranged tightly and electrically connected vertically. Therefore, it provides electrical contacts of anisotropic conduction, which is vertically electrical connection in micro pitch.

Therefore, the method for fabricating an anisotropic conductive substrate according to the present invention provides an effective way to fabricate the anisotropic conductive substrate. The way that the metal pins 21 are compressed to be vertical electrodes 40 inside the liquid compound 10 ensures that the electrodes 40 be formed independently to acquire anisotropic conduction for the applications of temporary fixed-direction of electrical connection.

Figure 5:
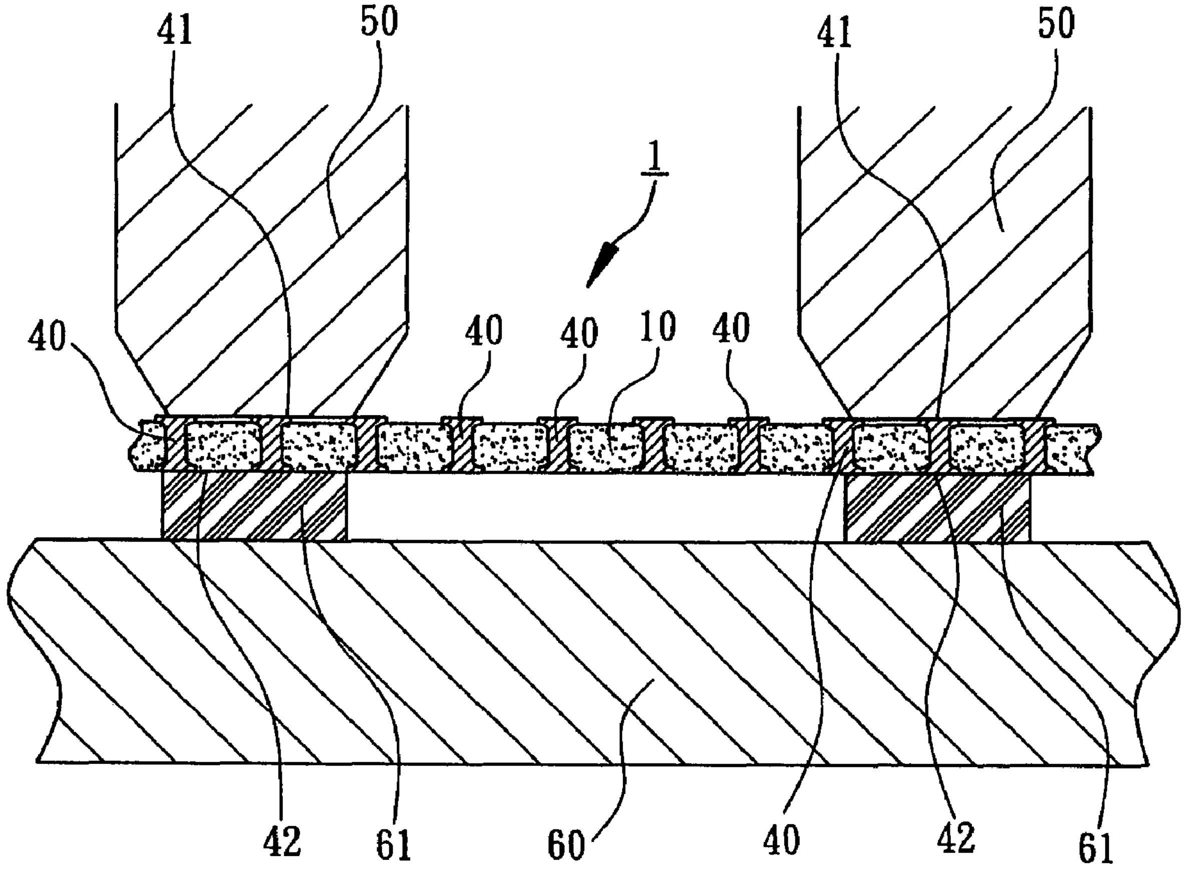
FIG. 5 is a partial cross-sectional view of the anisotropic conductive substrate placing under a semiconductor test apparatus in accordance with the present invention.
Figure 6A:
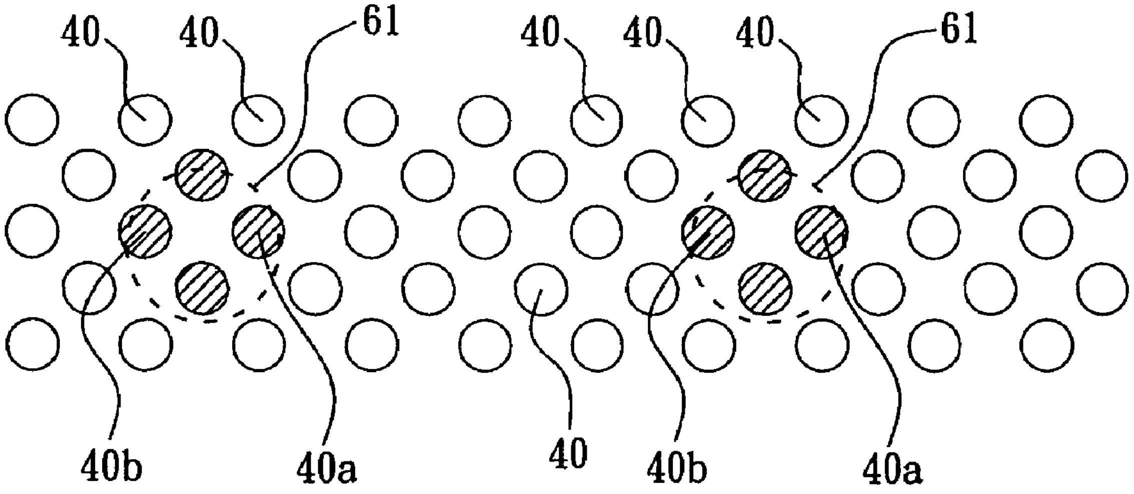
FIG. 6*a* to 6*b* are illustrations of corresponding positions of electrodes of the anisotropic conductive substrate and the electrodes of wafer under test in different dispositions in accordance with the present invention.
Figure 6B:
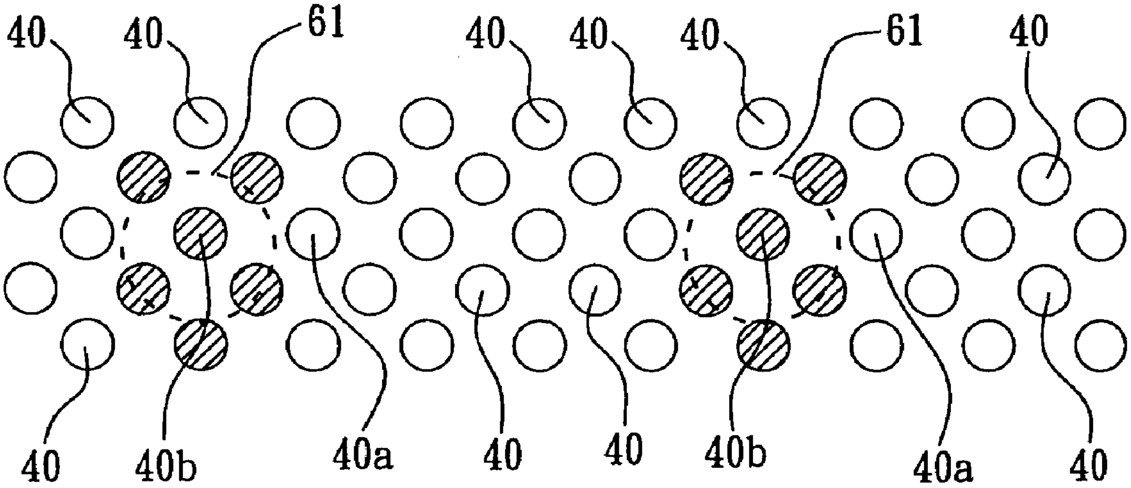

As shown in FIG. 5, the anisotropic conductive substrate 1 is placed between a burn-in board of a semiconductor burn-in testing apparatus and a wafer under test 60, and this is to prevent contamination of the testing apparatus. While the wafer 60 undergoing wafer-level electrical test, wafer-level burn-in test, or wafer-level burn-in and electrical parallel test, the probers 50 of burn-in board contact the anisotropic conductive substrate 1, and electrically connect to electrodes 61 (such as bumps or pads) of wafer 60 through electrodes 40 of the anisotropic conductive substrate 1 randomly. This will eliminate the damage causing by the direct contact of probers 50 with the electrodes 61 of wafer 60. Since the electrodes 40 are tightly and independently bonding to the liquid compound 10, anisotropic conduction still can be acquired even by micro pitch disposition of electrodes 40 and, therefore, no alignment of the anisotropic conductive substrate 1 is needed. As shown in FIG. 6*a*, when an electrode 61 of wafer 60 is electrically connected to the burn-in testing apparatus through a plurality of electrodes 40*a*, electrical connection still can be acquired through other electrodes 40*b*, as shown in FIG. 6*b*, even while the anisotropic conductive substrate 1 moving, expending or contracting. The problem of electrical short and failure of contact cab be eliminated.

The above description of embodiments of this invention is intended to be illustrative and not limiting. Other embodiments of this invention will be obvious to those skilled in the art in view of the above disclosure.

What is claimed is:

1. A method for fabricating an anisotropic conductive substrate comprising:

providing a back holder, the back holder having a surface with a plurality of metal pins;

forming a liquid compound on the surface of the back holder with the metal pins;

pressing the liquid compound on the back holder, the liquid compound being reshaped to have an upper surface and a lower surface, the thickness between the upper surface and the lower surface of the liquid compound is between 25 μm and 250 μm, the metal pins being deformed into a plurality of electrodes in the liquid compound and each electrode has a first end and a lower end exposed from the upper surface and the lower surfaces of the liquid compound; and removing the back holder so that the liquid compound with the electrodes becomes an anisotropic conductive substrate.

2. The method for fabricating an anisotropic conductive substrate as claimed in claim 1, wherein the liquid compound is a negative photoresist.

3. The method for fabricating an anisotropic conductive substrate as claimed in claim 1, wherein the liquid compound is a low K dielectric thermosetting material.

4. The method for fabricating an anisotropic conductive substrate as claimed in claim 3, wherein the liquid compound is cured simultaneously during the pressing step.

5. The method for fabricating an anisotropic conductive substrate as claimed in claim 1, wherein a removable layer is formed on the surface of the back bolder in the step of providing the back holder.

6. The method for fabricating an anisotropic conductive substrate as claimed in claim 5, wherein the removable layer is a positive photoresist.

7. The method for fabricating an anisotropic conductive substrate as claimed in claim 1, wherein the distribution density of the metal pins is between 103 mm-2 and 108 mm-2 in the step of providing the back holder.

8. The method for fabricating an anisotropic conductive substrate as claimed in claim 1, wherein the pitch between the metal pins is from 0.5 μm to 30m.

9. The method for fabricating an anisotropic conductive substrate as claimed in claim 1, further comprising a step of baking the liquid compound prior to the pressing step.

10. The method for fabricating an anisotropic conductive substrate as claimed in claim 1, wherein the liquid compound is transparent.

* * * * *